Jan. 16, 1951 J. F. BARRY 2,538,495

METALLIC CONTAINER SEALING METHOD

Filed Jan. 4, 1947 3 Sheets-Sheet 1

INVENTOR
J. F. BARRY
BY
[signature]
ATTORNEY

Jan. 16, 1951 J. F. BARRY 2,538,495

METALLIC CONTAINER SEALING METHOD

Filed Jan. 4, 1947 3 Sheets-Sheet 2

INVENTOR
J. F. BARRY
BY

ATTORNEY

METALLIC CONTAINER SEALING METHOD

Filed Jan. 4, 1947 3 Sheets-Sheet 3

INVENTOR
J. F. BARRY
BY [signature]
ATTORNEY

Patented Jan. 16, 1951 2,538,495

UNITED STATES PATENT OFFICE 2,538,495

METALLIC CONTAINER SEALING METHOD

Joseph F. Barry, Summit, N. J., assignor to Bell Telephone Laboratories, Incorporated, New York, N. Y., a corporation of New York Application January 4, 1947, Serial No. 720,263

3 Claims. (Cl. 219—12)

This invention relates to sealing apparatus and methods of manufacture particularly applicable to hermetically sealed piezoelectric quartz crystal or similar crystal units especially suitable for use as frequency standards and in communication systems.

The crystal blank is usually enclosed in a protective casing which is either highly evacuated or filled with dry air under controlled pressure so that the frequency range of the crystal blank may be held stable. When the casing is formed substantially wholly of metal, the crystal blank is mounted on two terminals insulatingly sealed in a base portion and the crystal is enclosed in a cover portion which is soldered or brazed to the base portion.

The soldering or brazing operation is generally performed in a furnace or oven in which the temperatures and time of fusion of the solder seal impose deleterious effects on the frequency characteristics of the crystal blank. The heat radiation encountered within the casing during the heat treatment to effect the seal is such that contamination may occur in the crystal blank or on the surface thereof which seriously affects the frequency characteristics and renders the crystal unstable in the frequency range for which it is intended.

One object of this invention is to facilitate the sealing of the unit casing without affecting the characteristics of the assembly mounted within the casing.

Another object of the invention is to localize the heating intensity of the seal so that radiation effects are eliminated and the temperature of the crystal blank remains normal whereby deleterious heating effects are prevented.

A further object of the invention is to produce the final sealing of the casing in a controlled atmosphere so that contamination of the crystal blank is avoided.

These objects are obtained in accordance with features of this invention by methods of manufacture involving in one step the provision of a local heating source which concentrates the heat energy at the point of the seal. This is accomplished in one way by providing a slotted high resistance heater element which is intimately in contact with the base of the casing and which readily heats the fusible metal in the peripheral moat or groove of the base so that the cover may be permanently sealed to the base. The conduction heating of the base is so rapid that heating by convection of the crystal blank is avoided and no deleterious effects are imposed on the crystal.

The final sealing of the casing unit involves a second step in a preliminary low vacuum treatment of the crystal casing to remove moisture and atmospheric contaminants and the injecting of a controlled low humidity atmosphere in the casing prior to sealing. This is accomplished in one way by mounting the unit in a bell jar, which may be evacuated to any desired degree, and supplying dry air to the jar for immersing the crystal blank in a controlled and predetermined environment whereby injurious gases or vapors are entirely eliminated and the frequency characteristics of the crystal remain constant throughout the operating life of the unit. The bell jar assembly is also provided with mounting means for the unit casing and an adjustable movable carbon pencil electrode for sealing the pin hole opening of the casing through which the unit is evacuated and filled with the controlled pressure of dry air.

A feature of this assembly is the sealing of the movable joint of the carbon or resistive pencil structure whereby the sealing of the crystal unit may be controlled at a point outside of the bell jar by the operator. The carbon pencil is supported on a standard which may be rotated and reciprocally moved to manipulate the pencil with respect to a plurality of units under process in the controlled atmosphere of the sealed bell jar. The standard extends through a tubular joint in the base of the jar and is coupled to a knob which is controlled by the operator. The standard is sealed from entrance of air through the joint by a resilient or yieldable sleeve rigidly clamped to the tubular joint and the knob extension on the standard. After the desired vacuum is attained in the bell jar or if a definite pressure of dry air is supplied to the enclosure including the unit casing, a solder coated insert placed over the pin hole opening in the side of the cover of the casing is contacted by the carbon pencil and heating current fuses the solder coating on the insert to seal the pin hole in the casing. This arrangement permits the seal to be effected in a controlled atmosphere so that injurious matter is eliminated from the sealed unit and thereby the constancy of the frequency characteristics may be preserved. Furthermore, this method materially reduces the number of rejects in quantity production of crystal units so that manufacturing costs are reduced.

These and other features of the invention will be more clearly understood from the following detailed description when considered with reference to the accompanying drawings, wherein.

Figure 1:
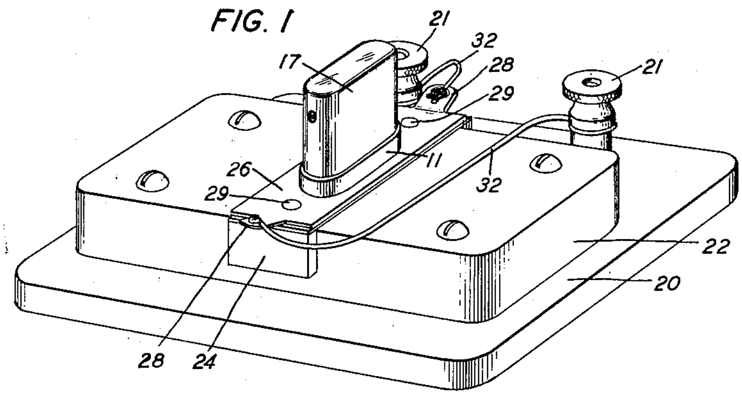
Fig. 1 is a perspective view of the complete assembly of apparatus for producing the main sealing joint between the components of the crystal unit casing.
Figure 2:
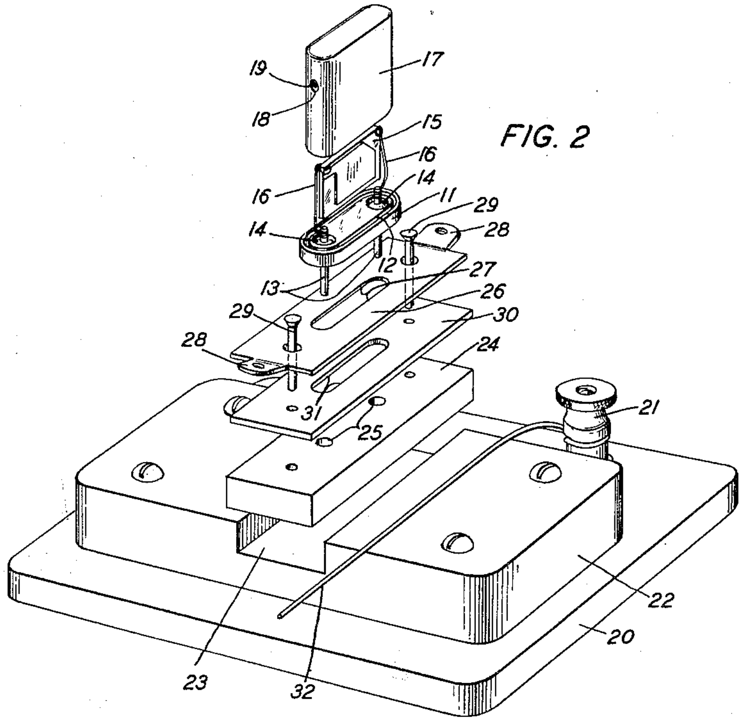
Fig. 2 is a similar view of the same apparatus partly exploded to illustrate details of the assembly.

Referring to the drawings, and particularly to Figs. 1 and 2, the main joint of the metallic casing for the crystal blank is sealed by a quick heating fixture or jig which locally raises the temperature of the solder material in the moat of the base or closure and prevents deleterious heating of the crystal blank by convection. The crystal unit, as shown in Fig. 2, comprises an elongated metallic base portion 11 having a moat or groove 12 extending around the rim and a pair of terminal prongs 13 hermetically sealed in integral eyelets of the base by glass beads 14 to form a vacuum-tight joint at the entrance points of the conductors leading into the casing. A piezoelectric crystal blank 15 is mounted vertically above the base by wire spring supports 16 attached to the inner ends of the terminals 13. The crystal blank is enclosed by a metallic cover portion 17 which is seated in the moat 12 of the base and sealed in a vacuum-tight manner, in accordance with the procedure of this invention.

The crystal blank 15 is readily affected by high temperature heating for prolonged periods to cause changes in the limits of the frequency characteristics for which it is intended. Furthermore, the plated electrode surfaces on the crystal may take on weight by such heating to which the crystal is subjected in sealing the casing during manufacture, as heretofore practiced. Principal aspects of this invention are to avoid such deleterious heating effects during the sealing and filling processes of the unit, whereby the crystal blank is protected against air, moisture condensation and oxidizing contamination which affect the frequency characteristics, and thereby tend to maintain such characteristics stable both during the manufacture processes and in subsequent operating life.

Prior to the sealing operations of the casing and the mounting of the crystal blank, the moat or groove 12 is provided with a filling of solder. This may be performed by painting the inner surface of the moat with an eutectic flux of zinc chloride-ammonium chloride or an organic resin flux and placing a preformed wire of a low melting point eutectic alloy, such as 49.8 per cent tin, 32 per cent lead and 18.2 per cent cadmium, in the moat. The solder melts at a temperature between 140 to 150 degrees C. to completely fuse to the surfaces of the moat. The cover 17 is also pretinned by dipping the open end to a depth of $\frac{1}{16}$ inch in a molten pool of the eutectic solder. After these tinning operations are completed, the elements of the casing are thoroughly washed and cleaned for five minutes in boiling water and dried, to remove resinous residue in the solder coating. In one example of the invention, the cover member 17 is provided with a circular indentation or recess 18 in the narrow side wall portion, which leads into a central pin hole aperture 19 for the final sealing operation of the casing. The recess 18 is also tinned in the same manner as described above. After the terminals 13 are sealed in the base and the crystal blank mounted thereon, the elements of the casing are ready for the sealing operations in accordance with this invention.

The main sealing joint of the base and cover members of the enclosing casing of the crystal blank is produced in accordance with this invention by a localized heating device or jig, shown in Figs. 1 to 5, inclusive. A bench top or base 20 is provided with two terminals 21 for connection to a suitable source of electrical heating energy, not shown, and a rectangular ceramic block 22 is affixed to the base by screws. The block has a central slot 23 formed therein transverse to the long dimension for frictional fitting of a removable heater element assembly which may be adapted for various types of crystal units to be sealed by this form of construction.

Figure 3:
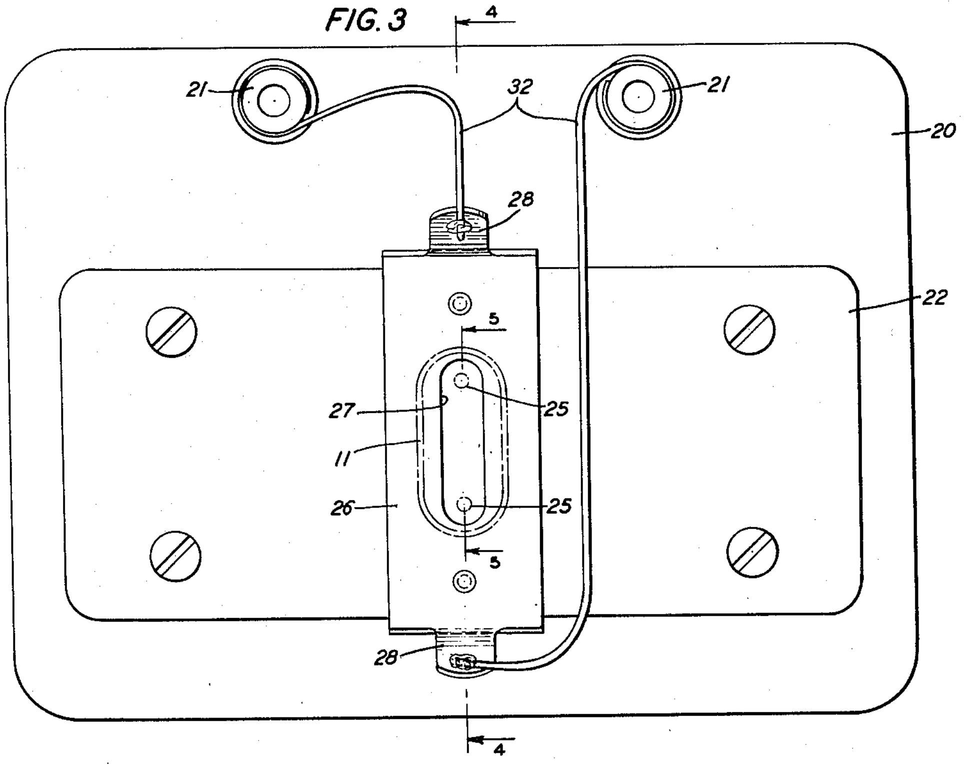
Fig. 3 is an enlarged plan view of the apparatus of Fig. 1 with the casing shown in dotted line superimposed on the heater element illustrative of this invention.

The removable assembly or heater element involves an elongated mounting block 24 of insulating material, which may be similar to block 22 and is provided with spaced socket cavities 25 for the reception of the terminal prongs 13 on the base 11 of the casing. The cavities and shape of block 24 are to prevent bending moment on the pins and eliminate heating near the terminals. A metallic heater strip 26, of high resistance material, such as a nickel-chromium alloy, obtainable commercially as "Nichrome" resistance alloy, serves as the heater element and is formed of a wide flat ribbon having a central elongated slot 27 therein to clear the sockets 25 in the block, as shown in Fig. 3. The strip 26 has a pair of integral ears 28 on opposite ends thereof and is attached to the block 24 by rivets 29 with an intermediate layer 30 of a heat resisting insulating plate, for example mica, which is also provided with a slot 31 coinciding with the slot in the heater element. A pair of flexible conductors 32 are connected to terminals 21 and soldered to the ears 28 on opposite ends of the heater element.

Figure 4:
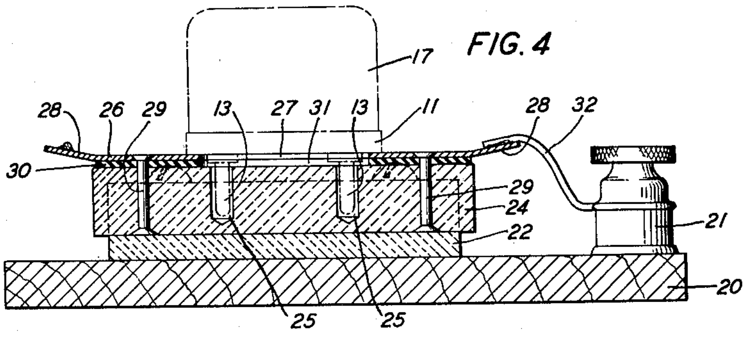
Fig. 4 is a cross-sectional view of the heater assembly taken on line 4—4 of Fig. 3 and showing the position of the unit which is being sealed.
Figure 5:
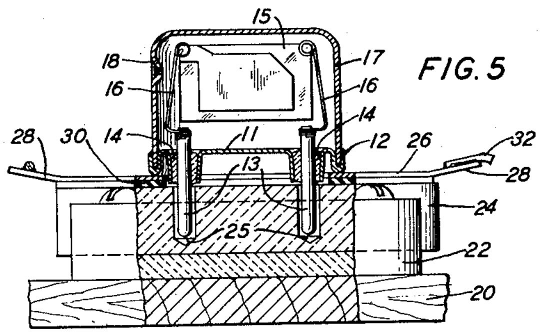
Fig. 5 is another cross-sectional view on line 5—5 of Fig. 3 and includes a cross-section of the crystal construction within the casing.

The flat resistance strip 26 forms a single short-circuit turn or loop of concentrated heating surface which is readily brought to a high temperature when energized by a low voltage, high current source, for example 6 volts and 25 amperes current. In the sealing operation, the crystal base 11 is placed in contact with the heater element by inserting the prongs 13 in the cavities 25 so that the peripheral moat 12 engages the surface of the strip adjacent the slot 27, as shown in Figs. 4 and 5. The close engagement of the peripheral groove 12 of the base portion 11 with the heater surface insures rapid heat conduction to fuse the solder filling in the groove so that the heating energy is localized in the peripheral groove and convection heating is minimized. This procedure prevents abnormal heating of the crystal blank since the portions of the base supporting the terminal prongs are positioned in the insulating air space of the slot 27 and the low heat absorption characteristic of the glass bead seals of the prongs prevents abnormal heating of the prongs and consequently the crystal blank is maintained relatively cool. It is desirable to preheat the base 11 prior to the various operations thereon such as moat tinning, soldering of springs, and sealing of the cover to the base. The preheating temperature should be approximately 100° C. and this heating may be produced by directing a stream of hot air toward the underside of the base or placing on a preheating surface. The heating element is raised to a high temperature and the fusible filling is rendered molten by conduction of heating energy in a relatively short time, i. e., between 1 and 1½ seconds, in which the peripheral portion of the base is heated to a temperature between 160 and 170° C., well above the melting point of the solder filling.

When the solder is molten, the cover member 16 is pressed into the moat 12 to fuse the molten filling to the solder film on the edge of the cover member and completely embed the rim of the cover in the solder filling. The heating source is disconnected from the strip heater which immediately cools and the solder filling may be solidified by rapid cooling, for example by directing a supply of air under low pressure toward the seal. It is preferable to apply a flux solution to the completed seal, for example a 25 per cent solution of rosin and alcohol, and thereafter reheat the seal for the same period to produce a strong mechanical joint and at the same time rectify any fault in the solder seal which may have been caused by air bubbles in the solder seal during the preliminary sealing operation.

The localized heating of the grooved portion of the base in combination with the rapid heating interval while rendering the solder filling to a molten state prevents heating of the crystal blank 15 either by convection or conduction so that oxidation or other contaminating effects during the sealing operation are avoided and the frequency characteristics remain stable. Furthermore, the close contact of the base with the heater element insures positive fusion of the sealed joint without endangering the hermetic glass seals of the terminal prongs supported in the base. Additionally, this method provides a structural assembly which protects the terminal prongs since they are inserted in the ceramic block 24 and are isolated from the heater by the cavity provided by the slots in the heater element and insulating spacer.

Figures 6, 9:
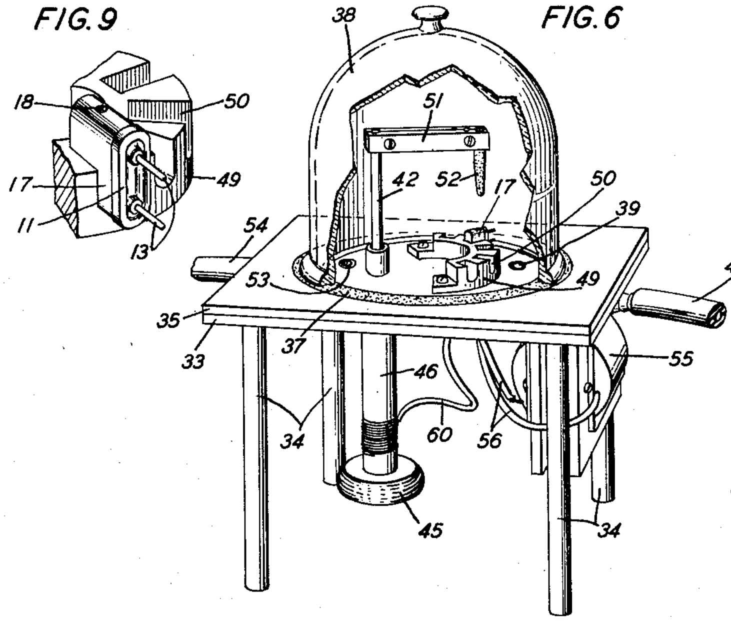
Fig. 6 illustrates, in a perspective view, the final sealing apparatus with a portion of the bell jar broken away to show the internal structure.
Fig. 9 illustrates in enlarged perspective view the holder for the crystal unit employed in the assembly of Fig. 6.
Figure 7:
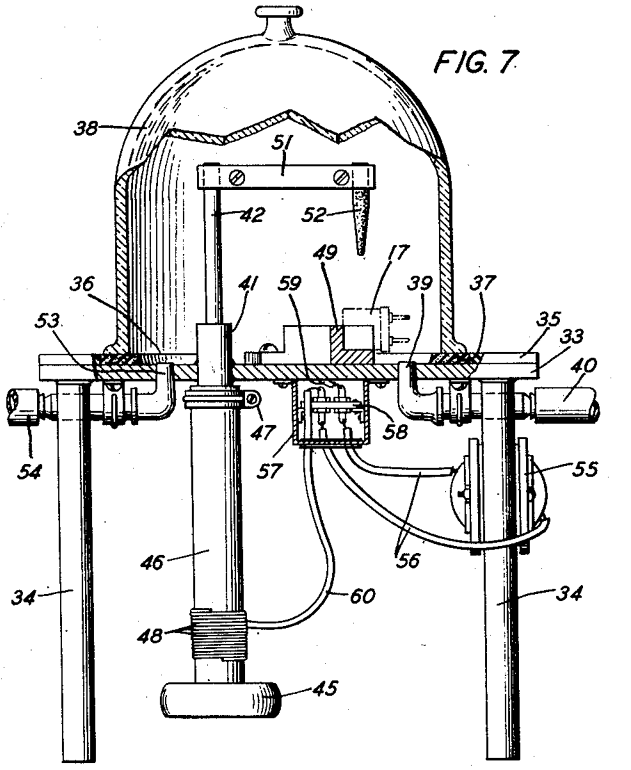
Fig. 7 is an elevational view, partly in cross-section, showing the details of the assembly for the final sealing of the crystal unit.
Figure 8:
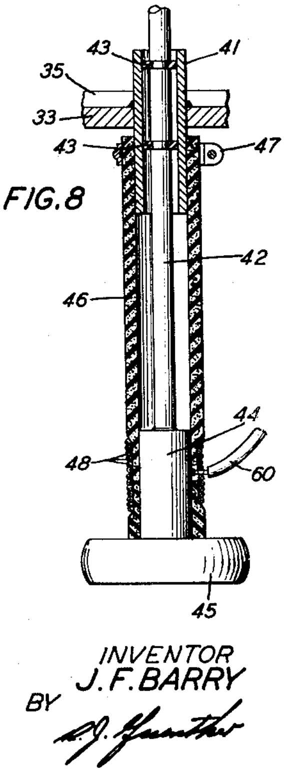
Fig. 8 is an enlarged detail view, in cross-section, of the sealed joints of the movable standard extending into the bell jar.

After the main seal is completed to enclose the crystal blank in the casing, the unit is subjected to a final sealing process, in accordance with this invention, by completing the sealing of the unit in a controlled atmosphere or environment whereby the unit is evacuated to a low degree to remove contaminating air and is either sealed under such low vacuum conditions or filled with dry air of low humidity, and finally sealed by closing the small pin hole opening 19 in the side of the casing. This method of sealing is illustrated in the apparatus of Figs. 6 and 7 in which a bell jar assembly is utilized during the sealing operation. The sealing assembly has a rectangular metallic base or plate 33 which is mounted in elevated position by four legs 34 secured at the corners thereof to form a table structure which may be mounted on a bench for convenient operation of the various controls utilized in performing the sealing operations in the enclosed chamber. The base is provided with an insulating layer 35 of thick sheet material having a large central cut-out portion 36 and an annular ring 37, for example of pliable rubber material, is seated within the cut-out portion of the layer 35 and rigidly attached to the metal base and the inner edge of the layer 35. The ring 37 forms a contact seal with the ground edge of a glass bell jar 38, which forms an enclosed chamber for performing the sealing operations, in accordance with this invention. A nozzle 39 extending below the table enters an opening leading into the chamber and is soldered or welded to the plate 33 with a coupling connection clamped to the table and a supply hose 40 connected to the coupling for evacuating the chamber enclosed by the bell jar. A metallic tubular member 41 extends through the plate 33 and is rigidly fixed in position by soldering the mid-portion to the plate, the tubular member being offset with respect to the axis of the chamber. A movable shaft or standard 42, for example a metallic rod, extends through the tubular member and is supported therein by a pair of spaced insulating bushings 43 which engage the inner wall of the tubular member as shown in Fig. 8. The shaft 42 is provided with an enlarged head 44 at the outer end and a hand knob 45, of insulating material, is rigidly affixed to the head 44. A resilient sleeve member 46, preferably of rubber tubing, extends between the tubular member 41 and the head 44 to form a flexible coupling joint between the tubular member 41 and the standard assembly, the rubber sleeve being sealed to the tubular member and rigidly affixed thereto by a clamp 47. The sleeve is also sealed to the head 44 by a suitable adhesive and rigidly held thereon by a wire binding 48.

A metallic holding fixture 49, shown more clearly in Fig. 9, having an arcuate form and provided with a plurality of slots 50 which conform to the shape of the crystal unit is rigidly affixed to the metallic plate 33 by screws, in spaced relation to the tubular member 41 and the shaft 42. The arcuate fixture is merely shown as an example of mounting a plurality of crystal units in the chamber for multiple sealing of the units during one operation. It is, of course, understood that the invention is not limited to this fixture since the mounting may be formed of a complete circle with the movable shaft in a central position at the axis of the chamber.

The offset shaft 42 is provided with a pair of metallic arms 51 which extend in parallel relation transversely to the shaft at the inner end thereof, the arms being attached at one end to the shaft by a screw and supporting a removable carbon pencil 52 at the opposite end. The pencil is suspended from the arms and directed toward the crystal units in the mounting jig 49 so that rotatable movement of the shaft 42 will permit the travel of the carbon pencil in an arc coinciding with the positions of the pin hole openings 19 in the crystal units mounted in the fixture. A short tube 53 extends through the plate 33 to form another inlet into the chamber opposite the vacuum inlet 39, the tube being attached exterior to the chamber to an air supply line or hose 54.

A transformer 55 is mounted below the base plate 33 for supplying welding current to the sealing fixture, the output of the transformer being connected to a pair of conductors 56 which extend into a conduit box 57 attached to the lower side of the base. The conductors are connected to a pair of terminals on a connector block 58 mounted within the conduit box. A short conductor 59 extends from one of the terminals to the undersurface of the base 33 and is welded thereto for supplying welding current to the mounting fixture 49. A conductor 60 connected to the other terminal, extends from the box and is soldered to the head 44 on the movable shaft, as shown more clearly in Fig. 8 to supply welding current to the movable shaft and finally to the carbon pencil electrode 52 which is brought in contact with the crystal units by manipulation of the movable shaft, to seal the pin hole opening in the crystal unit.

Figure 10:
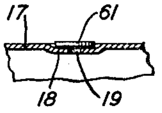
Fig. 10 is a fragmentary view, in cross-section, to an enlarged scale, of details of the pin hole seal in the side of the crystal casing.

In the final sealing process of the crystal units a plurality of units are mounted in the fixture 49, with the pin hole openings 19 uppermost in the mounting, and positioned in the slots 50 so that the terminal prongs 13 extend outwardly from the mounting. In this position the pin hole opening is aligned with the arcuate movement of the carbon pencil electrode 52 within the chamber. A tinned closure 61, preferably in the form of a disc as shown in Fig. 10, is placed in the recess of each unit in the mounting fixture, the tinned surface of the disc making rough contact with the recess so that air may be removed from the interior of the unit by the pumping system. When the mounting fixture is loaded with the tinned disc 61 placed in the recesses of the unit, as shown in Fig. 10, the bell jar 38 is placed on the ring 37 and the pumping system started to evacuate the chamber through the nozzle 39 to a low pressure of 1 to 3 inches of mercury absolute, and when all the air and moisture are removed from the crystal casings and the chamber, the final seal may be made if it is desired to maintain the crystal blank in a low pressure environment. The sealing is performed by manipulating the shaft 42 by the external hand knob 45 to bring the carbon pencil in line with the disc 61 of one of the units and lowering the carbon pencil electrode 52 into contact with the disc by pulling the knob 45 downwardly, whereupon the welding circuit is completed through the shaft and pencil and the disc on the casing in the mounting unit which latter forms the stationary electrode for the completion of the welding circuit. The heating current melts the solder coating on the disc and the disc is fused over the pin hole opening 19 in the casing to permanently seal the unit.

If it is desired to maintain the crystal blank in a gaseous environment at higher pressure this may be performed by following the same procedure of evacuation and then supplying dry air to the chamber through opening 53, the air supply being previously processed so that it does not exceed 18 per cent relative humidity at 25° C. to prevent the entrance of moisture into the sealed casing of the unit. The preferred practice in order to remove moisture and contaminating gases from the casing is to evacuate the chamber to a vacuum pressure of 1 to 3 inches of mercury absolute and then inject the dry air into the chamber, these operations being performed alternately several times to insure a relatively moisture free environment in the sealed casing. When this procedure is completed, the disc 61 is sealed by contact of the carbon pencil to close the opening 19 in each of the crystal units.

The final sealing assembly of this invention provides a controlled atmosphere for the sealing of the crystal unit wherein the sealing is performed manually by the operation of the movable electrode within the chamber and the construction of the movable electrode assembly permits the maintenance of a desired pressure in the chamber without contaminating air leaking into the chamber. This is produced by the yieldable and flexible sleeve on the standard assembly which permits reciprocal and rotatable movement of the electrode within the chamber by external manipulation so that the unit, after evacuation and filling, may be sealed while in the purified environment of the chamber and contamination of the filling is prevented.

It is, of course, understood that various modifications may be made in the detailed assembly of the structures and methods herein described, without departing from the scope and spirit of the invention as defined in the appended claims.

What is claimed is:

1. The method of hermetically sealing a metallic casing enclosing a crystal unit, said casing including a hollow cover member and a base member having insulated terminals projecting therefrom and having also a peripheral groove, comprising heating the base member to approximately 100° C., tinning said groove with a low melting point solder, solder coating the open end of said cover member, washing and drying said groove and cover member, enclosing the crystal units by said hollow cover member, said open end extending into said groove, applying heat locally to the grooved portion of said base member remote from said terminals, pressing said cover into said groove, interrupting said heating upon the melting of said solder, and rapidly cooling said groove and said open end of said cover member.

2. The method of solder sealing a metallic casing enclosing a crystal unit, said casing including a hollow cover member having a rim and a base member having insulated terminals projecting therefrom, a central portion and a peripheral groove, comprising directing a stream of hot air towards the underside of the base to heat the base to approximately 100° C., tinning said groove with a eutectic alloy solder having a melting point of approximately 145° C., tinning the rim of the hollow cover member with said solder, washing and drying said groove and said cover member, enclosing the crystal unit by said hollow cover member, said rim extending into said groove, applying heat directly to the grooved portion of said base only remote from said terminals and central portion for a period of approximately a second and a half melting said solder, pressing said cover into said groove, and directing a supply of air towards the solder joint to rapidly cool it.

3. The method of hermetically sealing a metallic casing enclosing a crystal unit including a hollow cover member and a base member having terminals supporting said crystal unit, a central portion, and a peripheral groove, comprising heating the base member to about 100° C., placing a low melting point solder in the groove of said base member, solder coating the open end of the cover member, placing a heating means in contact with the grooved portion of said base member with said central portion and said terminals removed therefrom, enclosing the crystal unit by said hollow cover member, said open end extending into said groove, supplying heat to said grooved portion through said means, pressing said cover into said groove while said solder is melting, interrupting said supplying of heat upon the melting of said solder, rapidly cooling the solder joint formed between said groove and cover member, applying the flux solution to said joint, and then again supplying heat to said grooved portions through said means for approximately the same period of time as priorly to produce a strong mechanical joint.

JOSEPH F. BARRY.

REFERENCES CITED

The following references are of record in the file of this patent:

UNITED STATES PATENTS

| Number | Name | Date |
|---|---|---|
| 485,017 | Ries | Oct. 25, 1892 |
| 617,375 | Voigt et al. | Jan. 10, 1899 |
| 946,192 | Azaria | Jan. 11, 1910 |
| 1,026,456 | Rambaud | May 14, 1912 |
| 1,369,919 | Eliel | Mar. 1, 1921 |
| 1,490,087 | Brenzinger | Apr. 15, 1924 |
| 1,660,784 | Blanksten | Feb. 28, 1928 |
| 1,790,787 | Badger | Feb. 3, 1931 |
| 1,949,450 | Brown | Mar. 6, 1934 |
| 1,992,588 | Trombetta et al. | Feb. 26, 1935 |
| 2,057,969 | Payson et al. | Oct. 20, 1936 |
| 2,101,156 | Payne | Dec. 7, 1937 |
| 2,175,314 | Reynolds | Oct. 10, 1939 |
| 2,326,296 | Harrison et al. | Aug. 10, 1943 |
| 2,401,006 | Longoria et al. | May 28, 1946 |
| 2,401,638 | Herzog et al. | June 4, 1946 |

FOREIGN PATENTS

| Number | Country | Date |
|---|---|---|
| 558,643 | Great Britain | Jan. 13, 1944 |